United States Patent
Herr et al.

(10) Patent No.: US 9,466,643 B2
(45) Date of Patent: Oct. 11, 2016

(54) GROUND GRID FOR SUPERCONDUCTING CIRCUITS

(71) Applicants: Quentin P. Herr, Ellicott City, MD (US); Anna Y. Herr, Ellicott City, MD (US); Steven Brian Shauck, Crofton, MD (US); Eileen Jiwon Min, Columbia, MD (US)

(72) Inventors: Quentin P. Herr, Ellicott City, MD (US); Anna Y. Herr, Ellicott City, MD (US); Steven Brian Shauck, Crofton, MD (US); Eileen Jiwon Min, Columbia, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 0 days.

(21) Appl. No.: 14/482,654

(22) Filed: Sep. 10, 2014

(65) Prior Publication Data

US 2016/0071903 A1    Mar. 10, 2016

(51) Int. Cl.
| | |
|---|---|
| *G11C 11/44* | (2006.01) |
| *H01L 27/18* | (2006.01) |
| *H01L 39/02* | (2006.01) |
| *H01L 39/22* | (2006.01) |
| *H01L 39/24* | (2006.01) |
| *H03K 19/195* | (2006.01) |
| *G11C 19/32* | (2006.01) |

(52) U.S. Cl.
CPC .............. *H01L 27/18* (2013.01); *H01L 39/025* (2013.01); *H01L 39/22* (2013.01); *H01L 39/223* (2013.01); *H01L 39/24* (2013.01); *H03K 19/195* (2013.01); *G11C 11/44* (2013.01); *G11C 19/32* (2013.01)

(58) Field of Classification Search
CPC ................. G11C 11/44; G11C 19/32
USPC .................................................. 365/160, 162
See application file for complete search history.

(56) References Cited

U.S. PATENT DOCUMENTS

| | | | | |
|---|---|---|---|---|
| 5,623,160 | A * | 4/1997 | Liberkowski | H01L 23/5382 257/209 |
| 6,184,477 | B1 * | 2/2001 | Tanahashi | H01L 23/50 174/261 |
| 6,388,332 | B1 * | 5/2002 | Aggarwal | H01L 27/118 257/207 |
| 6,453,444 | B1 * | 9/2002 | Shepard | G06F 17/5036 716/102 |
| 6,483,714 | B1 * | 11/2002 | Kabumoto | H01L 23/49822 174/250 |
| 2001/0025012 | A1 * | 9/2001 | Tarutani | H01L 27/18 505/100 |
| 2004/0159460 | A1 * | 8/2004 | Passiopoulos | H01P 3/006 174/117 FF |
| 2008/0169197 | A1 * | 7/2008 | McRuer | B01F 13/0076 204/600 |
| 2009/0233798 | A1 * | 9/2009 | Maeda | G01R 33/035 505/190 |
| 2015/0119252 | A1 * | 4/2015 | Ladizinsky | B82Y 10/00 505/170 |
| 2016/0034609 | A1 * | 2/2016 | Herr | G06F 17/505 716/104 |

* cited by examiner

*Primary Examiner* — Ly D Pham
(74) *Attorney, Agent, or Firm* — Tarolli, Sundheim, Covell & Tummino LLP

(57) ABSTRACT

One example includes a superconducting circuit. The circuit includes a plurality of layers comprising a first conductor layer and a second conductor layer overlying the first conductor layer, each of the first and second conductor layers comprising at least one signal element. The circuit also includes a ground grid that is conductively coupled to ground and comprises a first plurality of parallel ground lines that occupy the first conductor layer and extend in a first direction and a second plurality of parallel ground lines that occupy the second conductor layer and extend in a second direction that is orthogonal with respect to the first direction.

20 Claims, 3 Drawing Sheets

GROUND GRID FOR SUPERCONDUCTING CIRCUITS

TECHNICAL FIELD

The present invention relates generally to superconducting circuits, and more particularly to a ground grid for superconducting circuits.

BACKGROUND

In the field of digital logic, extensive use is made of well known and highly developed CMOS (complimentary metal-oxide semiconductor) technology. As CMOS has begun to approach maturity as a technology, there is an interest in alternatives that may lead to higher performance in terms of speed, power dissipation computational density, interconnect bandwidth, and the like. An alternative to CMOS technology comprises superconductor based single flux quantum circuitry, utilizing superconducting Josephson junctions, with typical signal power of around 4 nW (nanowatts), at a typical data rate of 20 Gb/s (gigabytes/second), or greater, and operating temperatures of around 4° Kelvin.

For decades, state-of-art for superconductor integrated circuits (ICs) typically had four metal layers, with either the top or bottom layers (or both) serving as a dedicated ground plane. In this geometry the ground return current flows below (or above) the signal wireup. More recently, state-of-art has moved to a larger number of metal layers, with sub-micrometer feature size with planarization. The concept of ground return above or below the signal trace in dedicated ground layers has been preserved. The problem is that as superconductor ICs scale to many metal layers at sub-micrometer feature size, the inductance of the lines using ground return paths above and/or below tends to be too large, as does cross-coupling between adjacent lines. Use of intermediate ground planes can alleviate this problem but is inefficient, as these ground planes reduce the number of metal layers available for wireup. Additionally, these intermediate ground planes need to be penetrated with through vias, and need to also have ground vias to provide a ground return path in the vertical dimension.

SUMMARY

One example includes a superconducting circuit. The circuit includes a plurality of layers comprising a first conductor layer and a second conductor layer overlying the first conductor layer, each of the first and second conductor layers comprising at least one signal element. The circuit also includes a ground grid that is conductively coupled to ground and comprises a first plurality of parallel ground lines that occupy the first conductor layer and extend in a first direction and a second plurality of parallel ground lines that occupy the second conductor layer and extend in a second direction that is orthogonal with respect to the first direction.

Another example includes a superconducting circuit. The circuit includes a plurality of layers comprising a ground layer, a first conductor layer, and a second conductor layer overlying the first conductor layer. Each of the first and second conductor layers include at least one signal element. The circuit also includes a ground grid that is conductively coupled to the ground layer and comprises a plurality of vias that extend vertically from the ground layer, a first plurality of parallel ground lines that occupy the first conductor layer and extend in a first direction, and a second plurality of parallel ground lines that occupy the second conductor layer and extend in a second direction that is orthogonal with respect to the first direction. Each of the first plurality of ground lines and the second plurality of ground lines can extend horizontally in each of the respective first and second conductor layers to interconnect a respective pair of the plurality of vias.

Another example includes an integrated circuit chip. The chip includes a plurality of superconductor circuit tiles that are each associated with a respective superconducting gate. Each of the plurality of superconductor circuit tiles includes a three-dimensional ground grid that is conductively coupled to a ground layer that extends between a ground moat at at least one periphery of the respective one of the plurality of superconductor circuit tiles. The three-dimensional ground grid can define a plurality of superconductor circuit cells and can include a plurality of longitudinal ground lines that define respective boundaries between adjacent cells of the plurality of the superconductor circuit cells and which occupy each of a plurality of conductor layers comprising at least one signal element for each respective one of the plurality of superconductor circuit cells.

DETAILED DESCRIPTION

The present disclosure relates to a physical layout style for superconductor integrated circuits (ICs) that provides a local current return path for wireup in all three dimensions. Local current return is critical for superconductor ICs in terms of lowering inductance, modeling inductance, reducing crosstalk, and controlling transmission line impedance. The inventive concept is to eliminate dedicated ground planes from the wireup and instead use a three-dimensional ground grid that provides a local current return path to all signal elements in the horizontal (X and Y) and vertical (Z) dimensions.

As one example, a regular array of ground wires can occupy layers that can correspond to wireup layers, such that the XY wireup layers are mirrored by parallel ground return paths that are interconnected with ground vias. As an example, the three-dimensional ground grid extends from a single ground layer in a direction that is orthogonal with respect to the ground layer (e.g., in the Z direction) in a substantially repeating pattern. For example, the pattern can be repeated on every other conductor layer, such that the signal elements of the conductor layers can be substantially parallel with and between the horizontal portions of the three-dimensional ground grid in orthogonal directions from one conductor layer to a next conductor layer above or below. As a result, the inductance of the ground return path for a given superconducting signal (e.g., associated with a Josephson junction or Josephson transmission line (JTL)) can be controlled.

Figure 1:
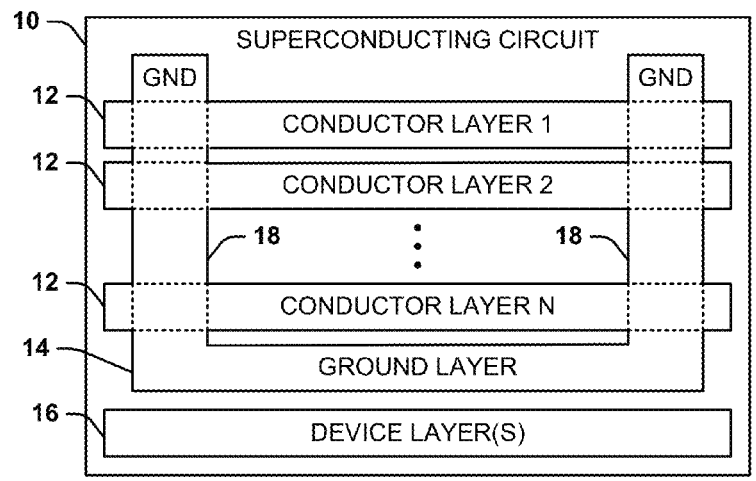
FIG. 1 illustrates an example of a superconducting circuit.

FIG. 1 illustrates an example of a superconducting circuit 10. The superconducting circuit 10 can correspond to any of a variety of circuit components or portions of a circuit component in a classical, quantum, or combination of classical and quantum computing environments. The superconducting circuit 10 includes a plurality N of conductor layers 12, where N is a positive integer, a ground layer 14, and at least one device layer 16. The device layer(s) 16 can, for example, be associated with propagating a clock signal, providing inductive coupling of a signal, such as the clock signal or other bias signal, to additional layers, such as in a Reciprocal Quantum Logic (RQL) circuit implementation, and/or can include one or more Josephson junctions or other circuit device component(s). The conductor layers 12 can each be associated with at least one of signal routing (e.g., to and/or from other superconducting circuits), inductive coupling (e.g., between the conductor layers 12 or from the device layer(s) 16), and/or at least one Josephson junction (e.g., as a JTL). Therefore, the conductor layers 12 can correspond to a wireup for carrying signals (e.g., single flux quantum (SFQ) pulses).

The ground layer 14 can correspond to a coupling to a low-voltage rail (e.g., ground) for providing a ground return path for the signals propagating in the conductor layers 12. A physical distance of signal propagation to a ground return path can correspond to a source of inductance for a signal in a superconducting computer environment. Such inductance can result in reduced signal strength, time delays of signals, and/or timing mismatch between multiple signals in the associated quantum computing system. In the example of FIG. 1, the superconducting circuit 10 includes a three-dimensional ground grid 18 that is conductively coupled to the ground layer 14 and which extends in a direction that is orthogonal to the ground layer 14, such that portions of the three-dimensional ground grid 18 occupy the conductor layers 12. For example, the portions of the three-dimensional ground grid 18 can be patterned from a set of conductors in the conductor layer to interconnect respective pairs of vias of the three-dimensional ground grid 18 that extend from the ground layer 14.

Therefore, portions of the conductor layers 12 can be used to form the respective portions of the three-dimensional ground grid 18 in the same physical layer to provide a predetermined measure of control over the inductance of the respective ground return path of the signals that propagate in the respective conductor layers 12. As a result, the superconducting circuit 10 can implement lateral (XY-plane) conductive coupling to the associated low-voltage rail (e.g., ground), and can implement vertical (Z-axis) coupling to other conductor layers 12. For example, the conductive couplings can have a substantially equal distance to the ground connections in this manner to provide an approximately equal or predetermined inductance of the signals that propagate in the respective conductor layers 12. Such implementation can provide an improved control over the inductance of the respective ground return path of the signals that propagate in the respective conductor layers 12, as opposed to typical superconducting circuits that include multiple ground layers that are interleaved between conductor layers, and which implement vias through holes in the ground layer(s) to conductively couple respective conductor layers and vertical connections to the respective ground layers for low-voltage rail conductive coupling. For example, the superconducting circuit 10 can implement approximately equal inductance ground return path connections to provide a more uniform signal response timing for signals propagating in the conductor layers 12 (e.g., via JTL connections to and/or from other superconducting circuits).

As an example, the superconducting circuit 10 can correspond to a superconducting circuit cell that can be a portion of an integrated superconducting circuit. For example, the three-dimensional ground grid 18 can define a periphery of the superconducting circuit cell, such that the three-dimensional ground grid 18 can be formed as a substantially cage-like structure that substantially encloses circuit components and signal elements in the conductor layers 12 and/or the device layer(s) 16. As described herein, the term "signal element" refers to one or more conductors on which a signal (e.g., an SFQ pulse) can propagate, such as associated with signal routing, an inductor, a Josephson junction, a portion of a logic gate, or a variety of other signal-carrying functions. Thus, an adjacent superconducting circuit cell can share an adjoining portion of the three-dimensional ground grid 18, such as with respect to a pair of vias and/or lateral connecting horizontal conductors occupying the conductor layers 12. Therefore, as described herein, the term "superconducting circuit cell" corresponds to a portion of a superconducting circuit that includes at least a portion of a three-dimensional ground grid enclosing at least a portion of the superconducting circuit based on vertical vias and horizontal conductors that conductively couple pairs of the vias at a periphery of the portion of the superconducting circuit. Accordingly, the superconducting circuit cells can be arranged as an array with shared portions of the three-dimensional ground grid that define boundaries between the superconducting circuit cells. For example, the array of superconducting circuit cells can form a superconducting circuit tile that is associated with a superconducting gate device that is part of the integrated superconducting circuit. As an example, the gate can operate as a D-register, an AND-gate, an inverter, or any of a variety of other types of logic gates in a superconducting circuit. Accordingly, the inductance of all conducting signal portions can be controlled via conductive couplings to the common three-dimensional ground grid 18 of each of the superconducting circuit cells, and thus the superconducting circuit tile, such as based on having an approximately equal length conductive coupling to ground.

Figure 2:
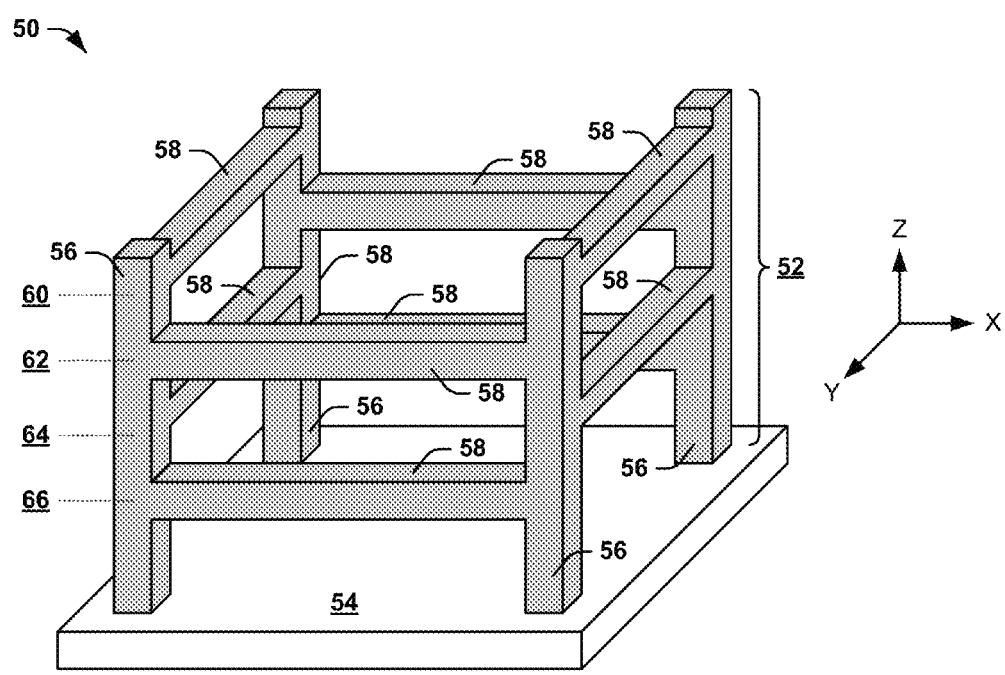
FIG. 2 illustrates an example of a three-dimensional ground grid system.

FIG. 2 illustrates an example of a three-dimensional ground grid system 50. The three-dimensional ground grid system 50 can correspond in part to the three-dimensional ground grid 18 in the example of FIG. 1. Therefore, reference is to be made to the example of FIG. 1 in the following description of the example of FIG. 2. As an example, the three-dimensional ground grid system 50 can correspond to the three-dimensional ground grid structure for a single superconducting circuit cell that forms a portion of a superconducting circuit tile.

The three-dimensional ground grid system 50 includes a three-dimensional ground grid 52 that is conductively coupled to a ground layer 54. The three-dimensional ground grid 52 includes four vias 56 that each extend along the Z-axis from the ground layer 54. The four vias 56 can thus each define an orthogonal corner of a superconducting circuit cell. The four vias 56 are conductively coupled via a plurality of horizontal ground conductors 58 that extend in the XY plane to couple respective pairs of the vias 56. The horizontal ground conductors 58 can correspond to the portions of the three-dimensional ground grid 18 that occupy the respective conductor layers 12 in the example of FIG. 1.

In the example of FIG. 2, a first oppositely-disposed pair of the horizontal ground conductors 58 extends along the Y-axis and occupies a layer demonstrated at 60. As an example, the layer 60 can include one or more signal elements that likewise extend along the Y-axis between the first oppositely-disposed pair of the horizontal ground conductors 58 and which corresponds to a first of the conductor layers 12. Similarly, a second oppositely-disposed pair of the horizontal ground conductors 58 extends along the X-axis and occupies a layer demonstrated at 62. As an example, the layer 62 can include one or more signal elements that likewise extend along the X-axis between the second oppositely-disposed pair of the horizontal ground conductors 58 and which corresponds to a second of the conductor layers 12. Furthermore, a third oppositely-disposed pair of the horizontal ground conductors 58 extends along the Y-axis and occupies a layer demonstrated at 64, and a fourth oppositely-disposed pair of the horizontal ground conductors 58 extends along the X-axis and occupies a layer demonstrated at 66. Therefore, the three-dimensional ground grid 52 extends from the ground layer 54 in a substantially repeated pattern (e.g., based on every other layer).

As described previously, the three-dimensional ground grid 18 can define a periphery of a superconducting circuit cell (e.g., the superconducting circuit 10). In the example of FIG. 2, the three-dimensional ground grid 52 is demonstrated as a substantially cage-like structure which can substantially enclose the signal elements associated with the respective conductor layers 12, such that each of the horizontal ground conductors 58 is occupies the same layer as the respective signal elements of the conductor layers 12. Thus, an adjacent superconducting circuit cell can share a pair of the vias 56 and a pair of the horizontal ground conductors 58 (e.g., in either the layers 60 and 64 or the layers 62 and 66) with respect to the three-dimensional ground grid that defines the periphery of the adjacent superconducting circuit cell. Based on the arrangement of the three-dimensional ground grid 52 with respect to the conductor layers 12 that it encloses, the inductance of the conductive coupling to the three-dimensional ground grid 52 can be controlled in each of the respective superconducting circuit cells in providing ground return paths for respective signals propagating in the conductor layers 12.

Figure 3:
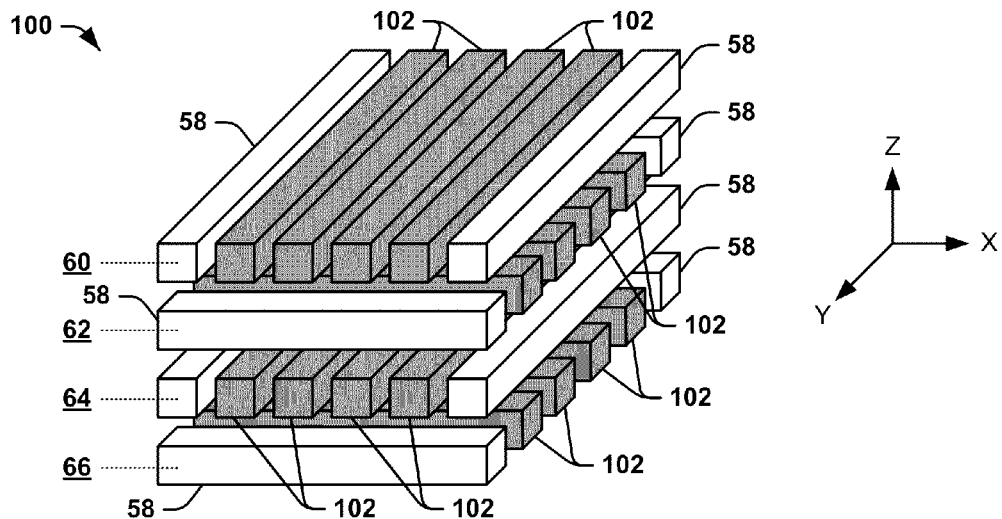
FIG. 3 illustrates an example of a superconducting circuit three-dimensional wireup system.

FIG. 3 illustrates an example of a superconducting circuit three-dimensional wireup system 100. The superconducting circuit three-dimensional wireup system 100 can correspond to a portion of the three-dimensional ground grid 52 in the example of FIG. 2, specifically the horizontal ground conductors 58, and respective signal elements of the respective conductor layers. Thus, like reference numbers and reference are made to the examples of FIGS. 1 and 2 in the following description of the example of FIG. 3.

The superconducting circuit three-dimensional wireup system 100 includes the plurality of horizontal ground conductors 58 associated with the three-dimensional ground grid 52, demonstrated as oppositely-disposed pairs in each of the layers 60, 62, 64, and 66. While the vias 56 are not demonstrated in the example of FIG. 3, it is to be understood that, pairs of the vias 56 can be respectively coupled by the horizontal ground conductors 58, similar to as demonstrated in the example of FIG. 2. In addition, the superconducting circuit three-dimensional wireup system 100 includes a plurality of signal elements 102 that are associated with the respective conductor layers 12. As an example, the signal elements 102 can correspond to JTLs along which signals (e.g., SFQ pulses) can propagate.

In the example of FIG. 3, a first set of the signal elements 102 extends along the Y-axis between the first oppositely-disposed pair of the horizontal ground conductors 58, such that they likewise occupy the layer 60. Similarly, a second set of the signal elements 102 extends along the X-axis between the second oppositely-disposed pair of the horizontal ground conductors 58, such that they likewise occupy the layer 62. Furthermore, a third set of the signal elements 102 extends along the Y-axis between the third oppositely-disposed pair of the horizontal ground conductors 58, such that they likewise occupy the layer 64, and a fourth set of the signal elements 102 extends along the X-axis between the fourth oppositely-disposed pair of the horizontal ground conductors 58, such that they likewise occupy the layer 66. As a result, in the example of FIG. 3, the superconducting circuit three-dimensional wireup system 100 is demonstrated as an XY wireup with alternating directions of extension of the signal elements 102 and the horizontal ground conductors 58 with respect to the layers 60, 62 64, and 66. As an example, the horizontal ground conductors 58 and the signal elements 102 can be patterned separately from each other in each of the respective layers 60, 62, 64, 66 during fabrication. For example, a common set of conductors in each of the X-axis and the Y-axis can be patterned to form the horizontal ground conductors 58 and the signal elements 102 in each of the respective layers 60, 62, 64, 66 during fabrication.

Based on the arrangement of the three-dimensional ground grid 52, the signal elements 102 can thus be coupled to the horizontal ground conductors 58 in a manner that provides for predetermined control of the inductance of the ground return paths of the signals propagating on the signal elements 102. For example, the signal elements 102 can be coupled to the horizontal ground conductors 58 that occupy the same layer as the respective signal elements 102 or can be coupled to horizontal ground conductors 58 in a layer directly above or below the layer of the respective signal elements 102, such as based on a location of the specific conductor 102 (e.g., with respect to the horizontal ground conductors 58 on the same layer). Accordingly, the physical length of the coupling of the signal elements 102 to the low-voltage rail (e.g., ground) can be better controlled based on the arrangement of the three-dimensional ground grid 52 with respect to the signal elements 102.

While the example of FIG. 3 demonstrates that each of the layers 60, 62, 64, and 66 include four signal elements 102, it is to be understood that the signal elements 102 demonstrate potential locations of the signal elements 102 in each of the respective layers 60, 62, 64, and 66. For example, the layers 60, 62, 64, and 66 are not limited to being arranged substantially the same (e.g., including four continuous signal elements 102), but can be configured in different ways and with a different number or arrangement of signal elements 102 with respect to each other based on the arrangement of the associated superconducting circuit 10.

Figure 4:
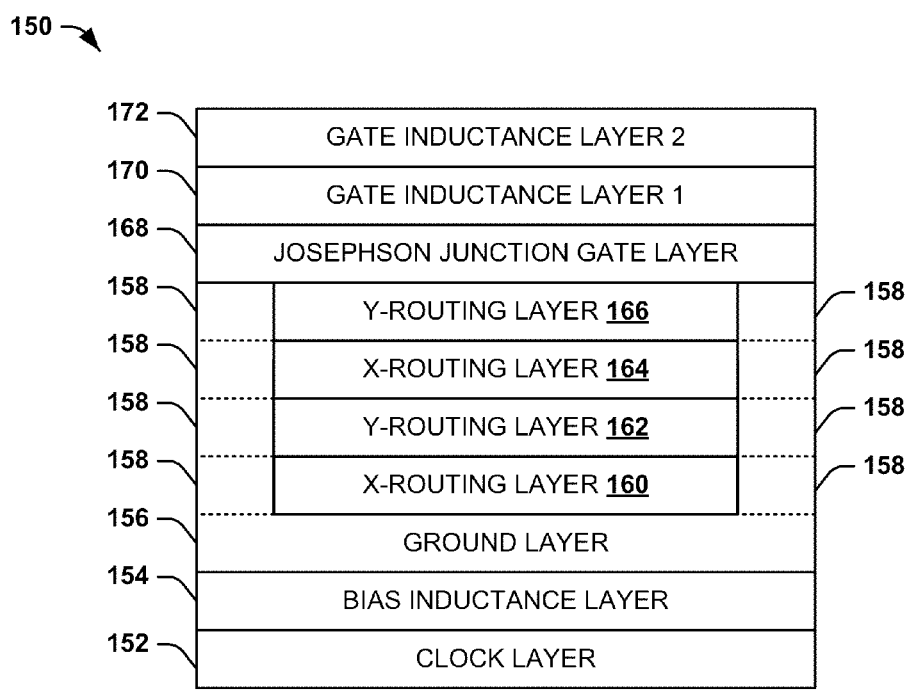
FIG. 4 illustrates an example diagram of a superconducting circuit cell.

FIG. 4 illustrates an example diagram of a superconducting circuit cell 150. The superconducting circuit cell 150 can correspond to a multi-layer superconducting circuit cell that can be a portion of a superconducting circuit tile that is associated with a superconducting gate.

In the example of FIG. 4, the superconducting circuit cell 150 is demonstrated as a block diagram of a ten layer stack. A first layer 152 is demonstrated as a clock layer, such as can be provided a clock signal (e.g., an AC signal or AC quadrature signal). A second layer 154 is demonstrated as a bias inductance layer to which the clock signal can be inductively coupled to provide a bias current potential for triggering Josephson junctions associated with the superconducting circuit cell 150. As an example, the clock layer 152 and the bias inductance layer 154 can have portions that are inductively coupled to provide the clock signal at at least one polarity to provide sequential triggering of the respective Josephson junctions (e.g., in an RQL circuit implementation). Alternatively, the clock layer 152 and the bias inductance layer 154 can respectively receive and induce a DC bias signal, such as to provide bias for the Josephson junctions for input signals provided via other layers of the superconducting circuit cell 150.

The superconducting circuit cell 150 also includes a ground layer 156 that can be conductively coupled to a low-voltage rail (e.g., ground), and four conductor layers overlying the ground layer 156. The four conductor layers are demonstrated as a first X-routing layer 158, a first Y-routing layer 160, a second X-routing layer 162, and a second Y-routing layer 164 successively overlying each other. Each of the conductor layers 158, 160, 162, and 164 can include at least one conductor that extends along the respective one of the X-axis (e.g., the conductor layers 158 and 162) or the Y-axis (e.g., the conductor layers 160 and 164). For example, the conductor(s) in each of the conductor layers 158, 160, 162, and 164 can be implemented as JTLs to route SFQ pulses to and from other superconducting circuit cells. In addition, in the example of FIG. 4, the superconducting circuit 150 includes a three-dimensional ground grid 166 that is conductively coupled to the ground layer 156 and which extends in a direction that is orthogonal to the ground layer 156 (i.e., the Z-axis), such that portions of the three-dimensional ground grid 166 occupy the conductor layers 158, 160, 162, and 164, similar to as described previously with respect to the examples of FIGS. 2-4. Therefore, the inductance of the conductive coupling to the three-dimensional ground grid 166 can be controlled in the superconducting circuit cell 150 in providing ground return paths for respective signals propagating in the conductor layers 158, 160, 162, and 164.

The superconducting circuit cell 150 also includes a Josephson junction device layer 168 overlying the second Y-routing layer 164, a first gate inductance layer 170 overlying the Josephson junction device layer 168, and a second gate inductance layer 172 overlying the first gate inductance layer 170. The Josephson junction device layer 168 can include at least one Josephson junction that can be associated with operation of a superconducting gate, such as associated with a superconducting circuit tile that includes the superconducting circuit cell 150. Similarly, the first and second gate inductance layers 170 and 172 can correspond to inductive couplings of signals (e.g., SFQ pulses) that are provided to and/or from the superconducting circuit cell 150, such as based on the at least one Josephson junction of the Josephson junction device layer 168. Accordingly, the superconducting circuit cell 150 can operate as an independent superconducting circuit or as part of a larger superconducting circuit (e.g., associated with a superconducting circuit tile).

Figure 5:
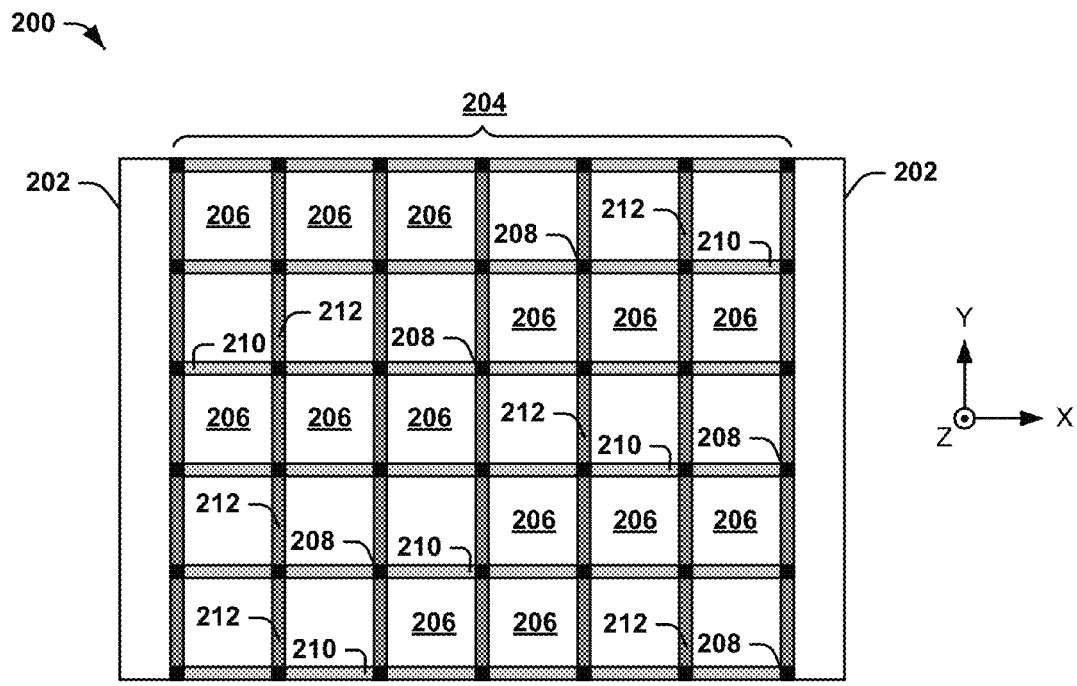
FIG. 5 illustrates another example of a three-dimensional ground grid system.

FIG. 5 illustrates another example of a three-dimensional ground grid system 200. The three-dimensional ground grid system 200 can include three-dimensional ground grides associated with a plurality of superconducting circuit cells arranged as an array, such that the three-dimensional ground grid system 200 can correspond to a superconducting circuit tile. The three-dimensional ground grid system 200 is demonstrated in the example of FIG. 5 in an overhead view (e.g., along the Z-axis).

The three-dimensional ground grid system 200 includes a ground moat 202 that substantially surrounds at least a portion of a three-dimensional ground grid 204. The three-dimensional ground grid 204 can be one integral conductor that is conductively coupled to the ground moat 202 and/or to a ground layer (e.g., the ground layer 54) that can likewise be coupled to the ground moat 202. The three-dimensional ground grid 204 can thus include individual three-dimensional ground grides associated with each of a plurality of superconducting circuit cells 206, such that the individual three-dimensional ground grides collectively correspond to the overall three-dimensional ground grid 204. In the example of FIG. 5, not all of the superconductor circuit cells 206 are demonstrated with a reference number for brevity and for clearly demonstrating other components.

The three-dimensional ground grid 204 includes a plurality of vias 208, a plurality of X-axis ground conductors 210 that each couple a respective pair of the vias 208, and a plurality of Y-axis ground conductors 212 that each couple a respective pair of the vias 208. Each of the X-axis ground conductors 210 can be associated with a separate layer from the Y-axis ground conductors 212, similar to as demonstrated in the examples of FIGS. 2-4. Due to the example of FIG. 5 demonstrating the three-dimensional ground grid system 200 in an overhead view, it is to be understood that the three-dimensional ground grid system 200 can be associated with a plurality of layers, such that there can be a plurality of X-axis ground conductors 210 and Y-axis ground conductors 212 that interconnect each pair of the vias 208. Thus, the three-dimensional ground grid system 200 can include additional X and Y-axis ground conductors 210 and 212 located below the demonstrated X and Y-axis ground conductors 210 and 212.

Each of the superconducting circuit cells 206 can be arranged substantially differently, such as variations of the superconducting circuit 10 and the superconducting circuit cell 150 in the examples of FIGS. 1 and 4, respectively. In the example of FIG. 5, each adjacent pair of the superconducting circuit cells 206 shares a pair of the vias 208 and one or more of the X-axis ground conductors 210 or one or more of the Y-axis ground conductors 212. Similar to as described previously, the X-axis ground conductors 210 and the Y-axis ground conductors 212 can be arranged to occupy the conductor layers of each of the superconducting circuit cells 206, such that signal elements extending along the X and Y-axes can extend parallel with and between the X-axis ground conductors 210 and the Y-axis ground conductors 212 for each of the superconducting circuit cells 206. As an example, each superconducting circuit cell 206 can be associated with a respective portion of an overall superconducting circuit of the superconducting circuit tile with which the three-dimensional ground grid system 200 is associated. For example, the superconducting circuit tile that includes the superconducting circuit cells 206 can be associated with a superconducting gate, such as to perform logic functions via SFQ pulses. Therefore, similar to as described previously, the inductance of the conductive coupling to the three-dimensional ground grid 204 can be controlled in the superconducting circuit tile that includes the superconducting circuit cells 206 in providing ground return paths for respective signals propagating in the conductor layers of the superconducting circuit cells 206.

Figure 6:
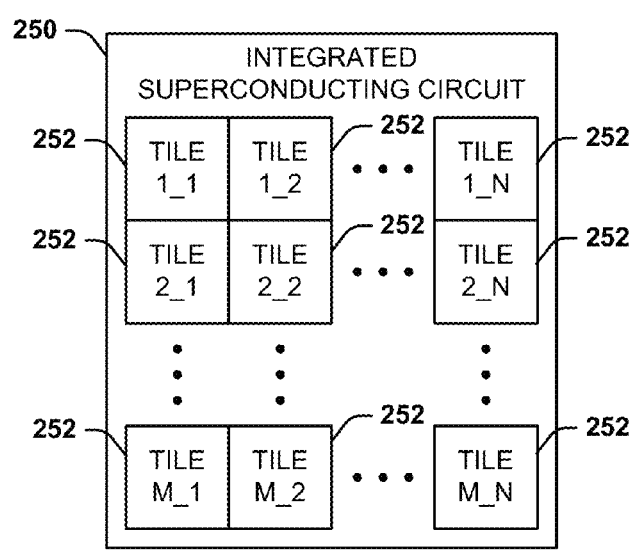
FIG. 6 illustrates an example of a superconducting integrated circuit.

FIG. 6 illustrates an example of a superconducting integrated circuit 250. The superconducting integrated circuit 250 can be configured as an integrated circuit (IC) chip that includes a superconducting circuit. As an example, the superconducting integrated circuit 250 can be fabricated in a manner that is substantially similar to a complementary metal-oxide semiconductor (CMOS) fabrication process. In the example of FIG. 6, the superconducting integrated circuit 250 includes a plurality of superconducting circuit tiles 252 arranged in an array of M rows and N columns, where M and N are positive integers. For example, each of the superconducting tiles 252 can be associated with a separate superconducting gate, such as to perform logic functions in a quantum, classical, or combination computing system. Each of the superconducting circuit tiles 252 can include a three-dimensional ground grid system, such as the three-dimensional ground grid system 200 in the example of FIG. 5. Therefore, each of the superconducting circuit tiles 252 can include a plurality of superconducting circuit cells, such as the superconducting circuit cell 150 in the example of FIG. 4. Thus, each of the superconducting circuit tiles 252 can have a controlled inductance for each of the signal elements in respective conductor layers based on the arrangement of the associated three-dimensional ground grid system, such as described herein.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A superconducting circuit comprising:
a plurality of layers comprising a first conductor layer and a second conductor layer overlying the first conductor layer, each of the first and second conductor layers comprising at least one Josephson transmission line configured to transmit a single flux quantum pulse; and
a ground grid that is conductively coupled to ground and comprises a first plurality of parallel ground lines that occupy the first conductor layer and extend in a first direction and a second plurality of parallel ground lines that occupy the second conductor layer and extend in a second direction that is orthogonal with respect to the first direction.

2. The circuit of claim 1, wherein the ground grid is arranged as a three-dimensional ground grid comprising a plurality of vias that extend vertically from a ground layer, and wherein the first and second pluralities of ground lines extend horizontally in a respective one of the first and second conductor layers to interconnect a respective pair of the plurality of vias.

3. The circuit of claim 2, wherein the superconducting circuit comprises a first superconducting circuit cell and a second superconducting circuit cell that is adjacent to the first superconducting circuit cell, wherein each of the first and second superconducting circuit cells has a periphery that is defined by the three-dimensional ground grid, and wherein a pair of the plurality of vias and a portion of the plurality of ground lines that interconnect the pair of the plurality of vias correspond to a boundary between the first and second superconducting circuit cells, such that the first and second superconducting circuit cells share the pair of the plurality of vias and the portion of the plurality of ground lines.

4. The circuit of claim 2, wherein the plurality of vias and the plurality of ground lines are coupled to provide a substantially cage-like structure of the three-dimensional ground grid that substantially encloses the at least one Josephson transmission line.

5. The circuit of claim 1, wherein each of the at least one Josephson transmission line associated with the first and second conductor layers are conductively coupled to at least one of the first and second pluralities of parallel ground lines at an approximately equal distance to provide a substantially controlled inductance between each of the at least one Josephson transmission line and the first and second pluralities of parallel ground lines.

6. The circuit of claim 1, wherein the at least one Josephson transmission line in each of the first and second conductor layers extends, respectively, in the first direction and the second direction parallel with and between respective pairs of the plurality of ground conductors.

7. The circuit of claim 1, wherein the plurality of layers comprises a ground layer, wherein the ground grid is configured as a three-dimensional ground grid that extends contiguously from the ground layer in a direction that is orthogonal with respect to the ground layer in a substantially repeated pattern in each of a plurality of additional conductor layers with respect to the plurality of parallel ground lines extending in orthogonal directions in each of consecutive overlying layers of the plurality of additional conductor layers.

8. The circuit of claim 1, wherein the superconductor circuit corresponds to a first superconductor circuit cell having a periphery that is defined by the plurality of ground lines of the three-dimensional ground grid, wherein a portion of the three-dimensional ground grid with respect to the plurality of ground lines is shared between the first superconductor circuit cell and a second superconductor circuit cell that is adjacent to the first superconductor circuit cell.

9. A superconductor circuit tile comprising a plurality of superconductor circuit cells of claim 8 arranged in a two-dimensional array, each of the superconductor circuit tiles being associated with a respective superconducting gate.

10. An integrated circuit chip comprising a plurality of superconductor circuit tiles of claim 9.

11. A superconducting circuit comprising:
a plurality of layers comprising a ground layer, a first conductor layer, and a second conductor layer overlying the first conductor layer, each of the first and second conductor layers comprising at least one signal element;
a ground grid that is conductively coupled to the ground layer and comprises a plurality of vias that extend vertically from the ground layer, a first plurality of parallel ground lines that occupy the first conductor layer and extend in a first direction, and a second plurality of parallel ground lines that occupy the second conductor layer and extend in a second direction that is orthogonal with respect to the first direction, each of the first plurality of ground lines and the second plurality of ground lines extending horizontally in each of the respective first and second conductor layers to interconnect a respective pair of the plurality of vias; and
a superconducting circuit cell having a periphery that is defined by the ground grid arranged as a three-dimensional ground grid, wherein a pair of the plurality of vias and a portion of the plurality of ground conductors that interconnect the pair of the plurality of vias correspond to a boundary of the superconducting circuit cells.

12. The circuit of claim 11, wherein each of the first and second conductor layers comprises at least one signal element that extends, respectively, in the first direction and the second direction parallel with and between respective pairs of the plurality of ground conductors.

13. The circuit of claim 12, wherein the ground grid is configured as a three-dimensional ground grid that extends contiguously from the ground layer in a direction that is orthogonal with respect to the ground layer in a substantially repeated pattern in each of a plurality of additional conductor layers with respect to the plurality of parallel ground lines extending in orthogonal directions in each of consecutive overlying layers of the plurality of additional conductor layers.

14. The circuit of claim 11, wherein each of the at least one signal element associated with the first and second conductor layers are conductively coupled to at least one of the first and second pluralities of parallel ground lines at an approximately equal distance to provide a substantially controlled inductance between each of the at least one signal element and the first and second pluralities of parallel ground lines.

15. The circuit of claim 11, wherein the superconducting circuit cell is a first superconducting circuit cell and the superconducting circuit further comprises a second superconducting circuit cell that is adjacent to the first superconducting circuit cell, wherein the second superconducting circuit cell has a periphery that is defined by another three-dimensional ground grid, and wherein the pair of the plurality of vias and the portion of the plurality of ground conductors that interconnect the pair of the plurality of vias correspond to a boundary between the first and second superconducting circuit cells, such that the first and second superconducting circuit cells share the pair of the plurality of vias and the portion of the plurality of ground conductors.

16. The circuit of claim 11, wherein the plurality of vias and the plurality of ground conductors are coupled to provide a substantially cage-like structure of the three-dimensional ground grid that substantially encloses the at least one signal element.

17. An integrated circuit (IC) chip comprising a plurality of superconductor circuit tiles that are each associated with a respective superconducting gate, each of the plurality of superconductor circuit tiles comprising a three-dimensional ground grid that is conductively coupled to a ground layer that extends between a ground moat at at least one periphery of the respective one of the plurality of superconductor circuit tiles, the three-dimensional ground grid defining a plurality of superconductor circuit cells and comprising a plurality of longitudinal ground lines that define respective boundaries between adjacent cells of the plurality of the superconductor circuit cells and which occupy each of a plurality of conductor layers comprising at least one signal element for each respective one of the plurality of superconductor circuit cells.

18. The IC chip of claim 17, wherein the three-dimensional ground grid comprises a plurality of vias that extend vertically from the ground layer and which are conductively coupled via the plurality of longitudinal ground lines, each of the plurality of vias defining an orthogonal corner of each of the plurality of superconducting cells.

19. The IC chip of claim 17, wherein a first portion of the plurality of longitudinal ground lines occupies a first one of the plurality of conductor layers of each of the plurality of superconductor circuit cells and extends in a first direction, wherein a second plurality of longitudinal ground lines occupies a second one of the plurality of conductor layers at least one of above and below the first one of the plurality of conductor layers of each of the plurality of superconductor circuit cells and extends in a second direction orthogonal with respect to the first direction.

20. The IC chip of claim 19, wherein each of the first one and the second one of the plurality of conductor layers of each of the plurality of superconductor circuit cells comprises at least one signal element that extends, respectively, in the first direction and the second direction parallel with and between respective pairs of the plurality of longitudinal ground lines.

\* \* \* \* \*